United States Patent [19]

Caywood

[11] 4,122,550
[45] Oct. 24, 1978

[54] LOW POWER RANDOM ACCESS MEMORY WITH SELF-REFRESHING CELLS

[75] Inventor: John M. Caywood, Sunnyvale, Calif.

[73] Assignee: Intel Corporation, Santa Clara, Calif.

[21] Appl. No.: 876,005

[22] Filed: Feb. 8, 1978

[51] Int. Cl.² .......................... G11C 7/00; G11C 7/06
[52] U.S. Cl. .................................... 365/222; 365/149; 365/194
[58] Field of Search ................ 365/149, 189, 194, 222

[56] References Cited

U.S. PATENT DOCUMENTS

| 3,866,061 | 2/1975 | Wen et al. | 365/194 |
| 4,030,083 | 6/1977 | Boll | 365/222 |

OTHER PUBLICATIONS

Boll et al., Automatic Refresh Dynamic Memory, ISSCC 76, 2/19/76, pp. 132, 133, of Digest of Technical Papers.

Primary Examiner—Stuart H. Hecker

[57] ABSTRACT

An MOS RAM employing capacitive storage cells where each cell includes a refreshing network which receives an AC signal for refreshing is disclosed. The refreshing signal is applied to the refreshing network through a depletion mode device which acts as a variable capacitor. Lower capacitance is provided when one binary state is stored in the cell, thus preventing undesirable charge from being retained within the cell when the opposite binary state is written into the cell. The refreshing signal is completely asynchronous with memory timing signals; thus, the memory may be accessed at any time.

16 Claims, 3 Drawing Figures

LOW POWER RANDOM ACCESS MEMORY WITH SELF-REFRESHING CELLS

BACKGROUND OF THE INVENTION:

1. Field of the Invention.

The invention relates to the field of random-access memories, particularly those employing self-refreshing cells.

2. Prior Art

There is a continuing demand for random-access memories (RAMs) which consume minimal amounts of power, particularly during a standby mode. Such memories are especially necessary for battery operated systems or where battery backup is employed during power failures. For the most part, the demand for such low power memories has been met with complementary MOS RAMs. However, these CMOS RAMs are more costly to fabricate when compared to other MOS memories.

The low power memory of the present invention employs n-channel devices in its presently preferred embodiment rather than CMOS devices. During standby, the memory draws only 20 microamps flrom a 5-volt supply for a 4K memory.

The self-refreshing, capacitance storage memory cell used in the disclosed memory is generally described in U.S. Pat. No. 4,030,083. One problem with the memory cell described in this patent is that complete asynchronous operation between the refreshing signal and accessing signals cannot be obtained. This application describes an improvement on this cell which permits complete asynchronous operation.

SUMMARY OF THE INVENTION

A memory device is described which includes capacitive storage means for storing electrical charge. An input control means is employed for selectively providing an electrical path to the capacitive storage means. A refreshing network is employed to refresh the charge stored on the capacitive storage means. This network includes a first and a second switching means, each having a pair of terminals and a control line. One terminal of each of these switching means is coupled to the capacitive storage means. The control line of the second switching means is coupled to the other terminal of the first switching means. A variable capacitance means is coupled between the other terminal of the second switching means and the control line of the second switching means. This capacitance means provides variable capacitance which has a predetermined relationship to the voltage across the capacitance means. By the application of a varying signal to this variable capacitance means, the state of charge in the capacitive storage means is continually refreshed.

DETAILED DESCRIPTION OF THE INVENTION:

A metal-oxide-semiconductor (MOS) random-access memory (RAM) is described. The memory employs self-refreshing capacitive storage memory cells and a low power input buffer.

In the following description, numerous specific details, such as specific threshold voltages, conductivity types, etc., are set forth to provide a thorough understanding of the invented memory. However, it will be obvious to one skilled in the art that the inventive concepts may be practiced without these specific details. In other instances, well-known structures and processes have not been described in detail in order not to obscure the invention in unnecessary detail.

In its presently preferred embodiment, the described RAM is fabricated as an MOS, integrated circuit on a p-type silicon substrate employing n-channel devices. Known silicon gate technology is employed in the fabrication of the memory. As realized, the memory is a 4K RAM requiring a +5 volt power supply with access times of approximately 150 nsec. The memory is formed on a substrate of approximately 150 mils by 150 mils. The memory draws approximately 10 milliamps when active and approximately 20 microamps in standby mode. The memory is automatically in the standby mode whenever the chip-enable (CE) signal is in its low state.

Figure 1:
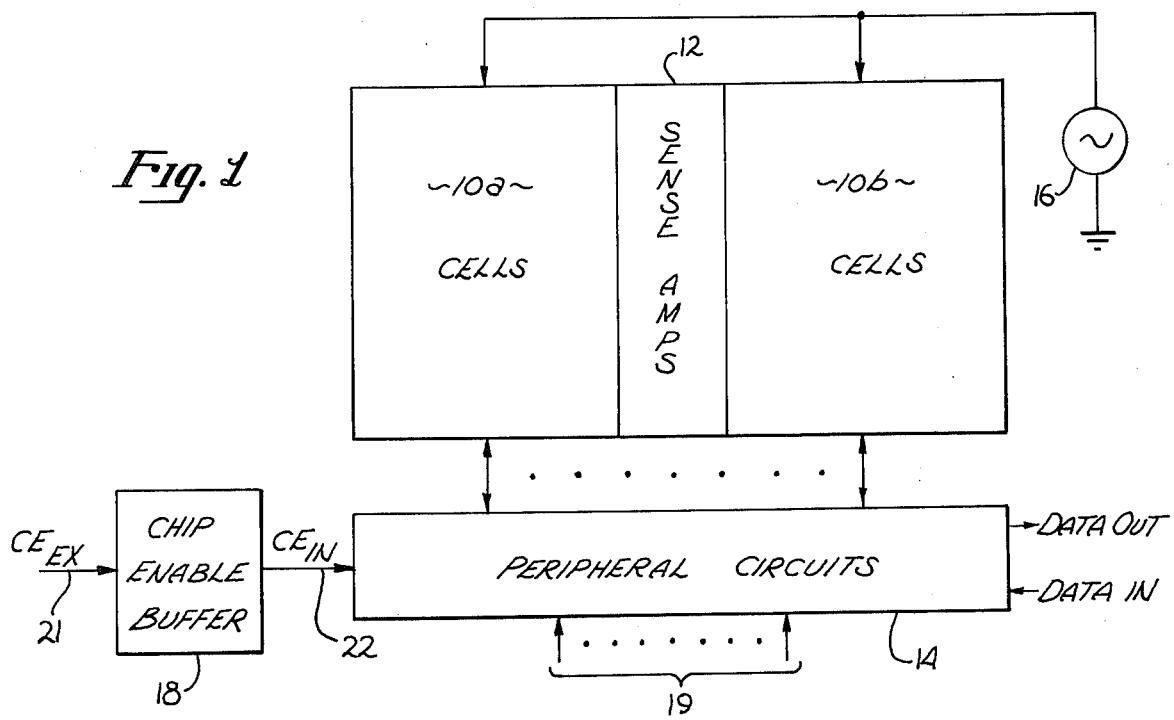
FIG. 1 is a general block diagram of the memory of the present invention.

Referring first to FIG. 1, the memory cells of the memory are organized into two (2) arrays, 10a and 10b, which are separated by a column of sense amplifiers 12. The peripheral circuits 14 include conventional circuits such as address buffers, decoders, data-in and data-out buffers, and timing circuits for generating internal timing signals for the memory. The peripheral circuits 14 thus receive a plurality of external signals such as address signals on lines 19.

The chip-enable buffer 18 is shown separately in FIG. 1 since this buffer is an extremely low power buffer which will be described in detail in conjunction with FIG. 3. The buffer 18 receives an external low level chip-enable signal on line 21 and provides an internal high level chip-enable signal on line 22 which is coupled to the peripheral circuits 14.

Figure 2:
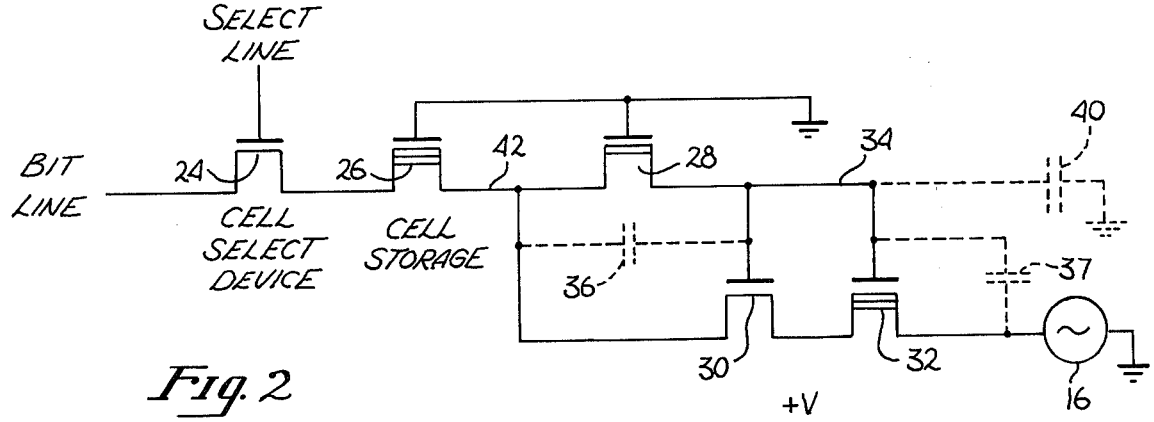
FIG. 2 is an electrical schematic of the memory cell employed in the memory of FIG. 1.

One of the plurality of identical memory cells employed in the arrays 10a and 10b of FIG. 1 is shown in detail in FIG. 2. These self-refreshing memory cells each require an area of approximately 2.1 mils$^2$ in the presently preferred embodiment. Each cell is coupled to receive a varying refreshing signal which, in the presently preferred embodiment, is an alternating current signal. An on-chip AC signal source 16, shown in FIGS. 1 and 2, is coupled to all of the cells in the array and provides the refreshing signal for the array. In the presently preferred embodiment, this signal has a peak-to-peak excursion of 7 volts and varies between +1.5 volts and +8.5 volts at a frequency of 5 KHz. An on-chip substrate bias generator (not illustrated) is also employed to provide a substrate bias of −3.5 volts.

The cell of FIG. 2 includes an input means for selectively coupling the capacitive storage means to a bit line. This input means consists of a field-effect, enhancement mode transistor 24. The gate of this transistor is coupled to a select line while one of its terminals is coupled to a bit line. A depletion mode transistor 26 is employed as the capacitive storage means for the cell. One terminal of this transistor is coupled to the other terminal of transistor 24. The other terminal of transistor 26 is coupled to a node 42.

Transistors 28, 30 and 32 form a refreshing network used to refresh or maintain the charge stored within the transistor 26. One terminal of the depletion mode transistor 28 is coupled to the node 42. The gate of this transistor along with the gate of transistor 26 are coupled to ground. The other terminal of transistor 28 is coupled to a node 34. The enhancement mode transistor 30 has one of its terminals coupled to node 42 and its gate coupled to node 34. A depletion mode transistor 32 has one of its terminals coupled to the other terminal of transistor 30 and its other terminal coupled to receive the refreshing signal from the source 16. The gate of the transistor 32 is coupled to the node 34. As will be explained in greater detail, transistors 28 and 30 are employed as switching devices for the refreshing network while transistor 32 is employed as a variable capacitor.

In the presently preferred embodiment, the threshold voltage of the enhancement mode transistors 24 and 30 is approximately +1 volt. The depletion mode transistors 26 and 32, both of which are employed as capacitors, have threshold voltages of approximately −2.5 volts. The depletion mode transistor 28 has a threshold voltage of approximately −1.5 volts. The process employed in the presently preferred embodiment which permits the fabrication of a plurality of transistors having different threshold voltages is described in U.S. Pat. No. 4,052,229. All the field-effect devices of FIG. 2 employ polycrystalline silicon gates in the presently preferred embodiment.

Some of the parasitic capacitance associated with a refreshing network of FIG. 2 are shown in broken lines for purposes of explanation. Specifically, the capacitance between nodes 42 and 34 is shown as capacitor 36, the capacitance between node 34 and ground as capacitor 40, and the capacitance associated with the gate of the transistor 32 and the refreshing signal line as capacitor 37.

For purposes of definition, the cell of FIG. 2 contains a binary-one with an absence of charge at the transistor 26 and a binary-zero when charge is present at transistor 26. These states are written into the cell in an ordinary manner through the transistor 24.

If the cell contains a binary-zero, transistors 26 and 28 are inverted, thus transistor 28 is conductive or "on". This transistor remains conductive throughout the entire excursion of the refreshing signal. The refreshing signal is coupled to node 34 through the capacitance associated with transistor 32 and the parasitic capacitor 37. The gate of transistor 30 is maintained at the potential of the negatively charged substrate surface since transistor 28 is on, thus transistor 30 does not conduct. For these conditions, the binary-zero stored within the transistor 26 remains unaffected by the refreshing signal. On the other hand, if a binary-one is stored within the transistor 26, transistor 28 remains generally off. The refreshing signal which is coupled to node 34 causes transistor 30 to turn-on for the more positive portion of the refreshing signal. When this occurs, any thermally generated charge which has accumulated within transistor 26 is removed through transistor 30 from the substrate surface which assures that the binary-one state is maintained. Thermally generated charge which accumulates at the gate of transistor 30 will cause transistor 28 to conduct when the refreshing signal is less positive. This undesirable negative charge is thus transferred to node 42 and subsequently swept away through transistor 30 by the refreshing signal when transistor 30 conducts.

The cell of FIG. 2, except for the variable capacitor/transistor 32, is described in U.S. Pat. No. 4,030,083. This prior art version of the cell, as described in this patent, has a problem which prevents asynchronous or independent operation between the refreshing and accessing signals. The parasitic capacitance in the prior art cell corresponding to the capacitor 37 is substantially larger than the capacitance associated with capacitors 36 and 40 to assure that the node corresponding to node 34 tracks the refreshing signal. If a binary-zero is stored at transistor 26, charge is attracted to node 34 when node 34 is driven strongly positive by the refreshing signal. If at this time, a binary-one is written into the cell, that is, the charge is removed from transistor 26, some charge will remain trapped on node 34. This charge is sufficient, in some cases, to cause transistor 28 to remain inverted, and thus prevents refreshing of the binary-one.

In U.S. Pat. No. 4,030,083, the solution proposed to prevent this problem is to bring the refreshing signal to its lower level when the cell is accessed. (For the p-channel embodiment shown in this prior patent, the refreshing signal is made more positive as shown in FIG. 4.) This solution increases access time since accessing cannot occur until the refreshing signal is at the proper potential. Moreover, true asynchronous operation is not possible. For example, if the same cell or line of cells is repeatedly accessed, the other cells will not be refreshed and the data stored in them is lost.

The solution to the above-described problem presented by this application includes the use of the variable capacitor formed by the transistor 32. This variable capacitor provides more capacitance when needed and less capacitance when the larger capacitance is not necessary. Specifically, assume that transistor 28 is off (binary-one storage); then, node 34 is isolated. In this case, transistor 32 acts as a capacitor to couple node 34 more positively and allow transistor 30 to be turned-on. On the other hand, if transistor 28 is on (binary-zero storage), node 34 only rises slightly. As the refreshing signal exceeds the potential on node 34, by an amount equal to the threshold voltage of transistor 32, the depletion region under the gate of transistor 32 collapses, preventing this device from acting as a capacitor. When transistor 32 does act as a capacitor, it provides substantial capacitance; thus, the parasitic capacitor 37 may be quite small. The smaller capacitor 37 after the collapse of the depletion region associated with transistor 32, provides substantially less coupling than with the prior art cell shown in U.S. Pat. No. 4,030,083. In practice the capacitive coupling is reduced by approximately 65% when the depletion region of transistor 32 collapses.

While in the presently preferred embodiment a depletion mode transistor 32 is employed as a variable capacitor, other means may be employed that provide a predetermined relationship between capacitance and the voltage across the capacitance means. For example, a PN junction may be able to be employed for this purpose.

With the variable capacitor described above, an insufficient amount of charge is attributed to node 34 by the refreshing signal to cause the problem encountered with the prior art cell. Therefore, asynchronous operation between the refreshing signal and accessing signals is achieved.

Figure 3:
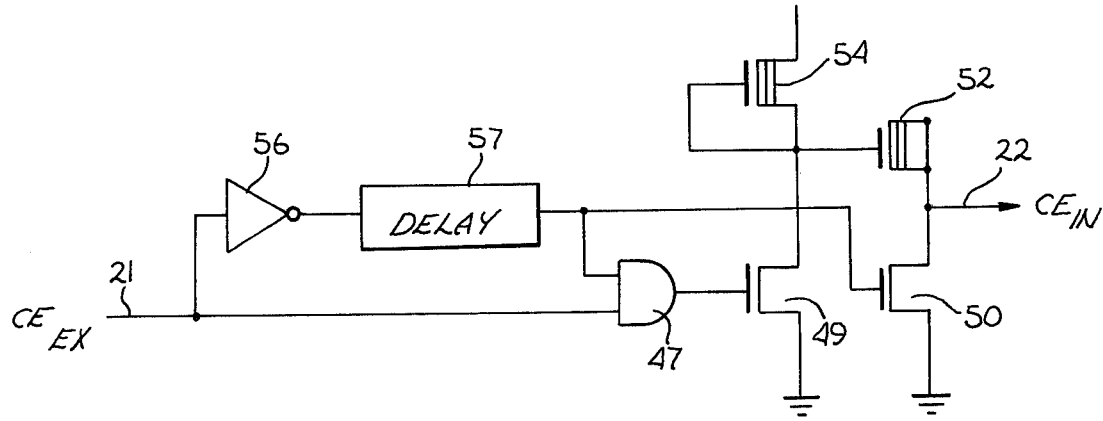
FIG. 3 is an electrical schematic of a buffer employed in the memory of FIG. 1.

Referring to the buffer of FIG. 3, the input (external) chip-enable signal on line 21 is coupled to one input terminal of an AND gate 47. This signal is also coupled through an inverter 56 to a time delay means 57. The output of the time delay means 57 is coupled to the other input terminal of the gate 47 and to the gate of a field-effect transistor 50. The output of the gate 47 is coupled to the gate of a field-effect transistor 49. The drain terminal of transistor 49 is coupled to a current source which, in the presently preferred embodiment, comprises a depletion mode transistor 54. A capacitor 52 is coupled between the drain terminals of transistors 49 and 50. Capacitor 52 may be a depletion mode transistor as shown in FIG. 3. An output signal (line 22) is obtained at the drain terminal of transistor 50. In the presently preferred embodiment, two driver stages are coupled to line 22 to accomodate the relatively large load which receives the CE signal.

The inverter 56, delay means 57 and AND gate 47 may be designed employing well-known circuit techniques. In the presently preferred embodiment, the delay provided by delay means 57 is approximately 6-7 nsec; this delay is inherent in the inverter 56, thus no separate delay means is required. This delay is sufficient to discharge the capacitor 52.

While in FIG. 3 an AND gate 47 is shown, other logic means may be employed. For example, a NAND gate may be used where transistor 49 is one of the transistors in the gate. A second transistor in series with transistor 49 provides the remaining logic for the NAND gate.

Assume that the input signal on line 21 is in its low state. For this condition, no output is present from the gate 47, and thus transistor 49 is off. Because of the inverter 56, transistor 50 is on. This causes the capacitor 52 to be charged. However, since transistor 50 is on, the output on line 22 is low.

When the signal on line 22 rises, the conditions for the AND gate 47 are met for the period of the delay introduced by the delay means 57. Thus, for approximately 6 to 7 nsec, both transistors 49 and 50 are turned on. This causes capacitor 52 to be discharged. After the delay, both transistors 49 and 50 to turn off, allowing line 22 to be pulled to a positive potential through the capacitor 52.

The advantage to this buffer is that this TTL-compatible buffer draws very little current except during the transition from one state to another.

Thus, a low standby power RAM has been described which employs capacitive storage cells. The AC signal used to refresh the cells may be completely asynchronous with the memory timing signals thereby permitting memory access at any time.

I claim:
1. A memory device comprising:
   capacitive storage means for storing electrical charge;
   input control means for selectively providing an electrical path to said capacitive storage means;
   a first switching means having a control line and a pair of terminals;
   a second switching means having a control line and a pair of terminals, one terminal of each of said first and second switching means coupled to said capacitive storage means, said control line of said second switching means coupled to the other terminal of said first switching means;
   a variable capacitance means for providing capacitance, the amount of said capacitance having a predetermined relationship to the voltage across said capacitance means, and capacitance means coupled between the other terminal of said second switching means and said control line of said second switching means;
   whereby, by the application of a varying signal to said variable capacitance means, the state of charge in said capacitive storage means is refreshed.

2. The memory device defined by claim 1 wherein said variable capacitance means comprises a depletion mode, field-effect transistor having a gate and a pair of terminals, said gate of said depletion mode transistor coupled to said control line of said second switching means and one terminal of said depletion mode transistor coupled to said other terminal of said second switching means.

3. The memory device defined by claim 2 wherein said first and second switching means each comprise a field-effect transducer and wherein said control lines comprise gates of said field-effect transistors.

4. The memory device defined by claim 3 wherein said capacitive storage means comprises a second depletion mode, field-effect transistor having a gate and a pair of terminals, said gate of said second depletion mode transistor coupled to said gate of said first switching means.

5. The memory device defined by claim 4 wherein said first switching means is a depletion mode transistor with a threshold voltage closer to zero volts than the threshold voltage of said second depletion mode transistor.

6. The memory device defined by claim 5 wherein said transistors are all n-channel devices employing polycrystalline silicon gates.

7. In a semiconductor memory device having a storage capacitor for storing electrical charge and an electrical network for refreshing said charge where said electrical network includes a first and a second transistor, each of which having a control electrode and a pair of terminals, one terminal of each of said transistors coupled to one terminal of the said storage capacitor, another terminal of said storage capacitor coupled to said control electrode of said first transistor, and said control electrode of said second transistor coupled to the other terminal of said first transistor, an improvement comprising:
   a variable capacitor coupled between the other terminals of said first and second transistors, said variable capacitor for providing a larger capacitance when said first transistor is in a non-conductive state and a smaller capacitance when said first transistor is in a conductive state;
   whereby, by the application of varying signals to said variable capacitor, the charge on said storage capacitor is refreshed.

8. The memory device defined by claim 7 wherein said variable capacitor comprises a depletion mode, field-effect transistor.

9. The memory device defined by claim 8 wherein said varying signal is coupled to one terminal of said depletion mode transistor.

10. The memory device defined by claim 9 wherein the other terminal of said depletion mode transistor is coupled to said other terminal of said second transistor, and the gate of said depletion mode transistor is coupled to said other terminal of said first transistor.

11. The memory device defined by claim 10 wherein said depletion mode transistor and said first and second transistors are n-channel devices.

12. A low power MOS buffer having an input terminal comprising:
   a first and a second field-effect transistor, each having a gate and a pair of terminals;

a capacitor coupled between one of said terminals of said first and second transistors;

a source of current coupled to said one terminal of said first transistors;

delay means for providing a time delay coupled between said input terminal and said gate of said second transistor;

gating means for providing a gated signal coupled to said delay means, said input terminal and said gate of said first transistor;

whereby no current is drawn by said first and second transistors except during a transition by said buffer from one state to another state.

13. The buffer defined by claim 12 wherein an inverter is coupled to said input terminal and wherein said inverter provides said delay.

14. The buffer defined by claim 13 wherein said gating means comprises a logic gate.

15. The buffer defined by claim 12 wherein said source of current comprises a depletion mode transistor.

16. The buffer defined by claim 15 wherein said capacitor comprises a depletion mode device.

* * * * *